(12) United States Patent
Bahreyni et al.

(10) Patent No.: US 8,446,078 B2
(45) Date of Patent: May 21, 2013

(54) MECHANICAL RESONATING STRUCTURES AND METHODS

(75) Inventors: Behraad Bahreyni, Port Moody (CA); David M. Chen, Brookline, MA (US); Alexei Gaidarzhy, Brighton, MA (US); Guiti Zolfagharkhani, Brighton, MA (US); Pritiraj Mohanty, Los Angeles, CA (US); Klaus Juergen Schoepf, Chandler, AZ (US)

(73) Assignee: Sand 9, Inc., Cambridge, MA (US)

( * ) Notice: Subject to any disclaimer, the term of this patent is extended or adjusted under 35 U.S.C. 154(b) by 112 days.

(21) Appl. No.: 12/732,575

(22) Filed: Mar. 26, 2010

(65) Prior Publication Data

US 2010/0314969 A1 Dec. 16, 2010

Related U.S. Application Data

(60) Provisional application No. 61/163,770, filed on Mar. 26, 2009.

(51) Int. Cl.
*H01L 41/08* (2006.01)

(52) U.S. Cl.
USPC .................... 310/368; 310/353; 310/334

(58) Field of Classification Search
USPC .............. 310/321, 328, 348, 367, 368, 369
See application file for complete search history.

(56) References Cited

U.S. PATENT DOCUMENTS

| | | | | |
|---|---|---|---|---|
| 2,410,825 A | * | 11/1946 | Lane | 310/352 |
| 4,139,793 A | * | 2/1979 | Michel | 310/353 |
| 4,443,728 A | * | 4/1984 | Kudo | 310/312 |
| 4,609,844 A | * | 9/1986 | Nakamura et al. | 310/321 |
| 4,900,971 A | * | 2/1990 | Kawashima | 310/361 |
| 5,001,383 A | * | 3/1991 | Kawashima | 310/367 |
| 5,025,346 A | | 6/1991 | Tang et al. | |
| 5,640,133 A | | 6/1997 | MacDonald et al. | |
| 5,914,553 A | | 6/1999 | Adams et al. | |
| 6,124,765 A | | 9/2000 | Chan et al. | |
| 6,739,190 B2 | | 5/2004 | Hsu et al. | |
| 6,828,713 B2 | | 12/2004 | Bradley et al. | |
| 6,909,221 B2 | | 6/2005 | Ayazi et al. | |

(Continued)

FOREIGN PATENT DOCUMENTS

| WO | WO 98/01948 A1 | 1/1998 |
|---|---|---|
| WO | WO 02/17481 A2 | 2/2002 |

(Continued)

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

(Continued)

*Primary Examiner* — Mark Dudd
(74) *Attorney, Agent, or Firm* — Wolf, Greenfield & Sacks, P.C.

(57) ABSTRACT

Apparatus and methods of connecting mechanical resonating structures to a body are described. Multi-element anchors may include a flexible portion that flexes when the mechanical resonating structure vibrates. The flexible portion may have a length related to the resonance frequency of the mechanical resonating structures. Some of the multi-element anchors include elements that are oriented perpendicularly to each other. MEMS incorporating such structures are also described.

29 Claims, 5 Drawing Sheets

U.S. PATENT DOCUMENTS

| | | | |
|---|---|---|---|
| 6,930,569 B2 | 8/2005 | Hsu | |
| 6,943,484 B2 | 9/2005 | Clark et al. | |
| 6,954,020 B2 | 10/2005 | Ma et al. | |
| 6,985,051 B2 | 1/2006 | Nguyen et al. | |
| 6,995,622 B2 | 2/2006 | Partridge et al. | |
| 7,005,946 B2 | 2/2006 | Duwel et al. | |
| 7,211,926 B2 | 5/2007 | Quevy et a | |
| 7,215,061 B2 | 5/2007 | Kihara et al. | |
| 7,352,608 B2 | 4/2008 | Mohanty et al. | |
| 7,492,241 B2 | 2/2009 | Piazza et al. | |
| 7,504,909 B2 | 3/2009 | Tada | |
| 7,667,369 B2 * | 2/2010 | Haskell et al. | 310/313 R |
| 7,724,103 B2 | 5/2010 | Feng et al. | |
| 7,791,432 B2 | 9/2010 | Piazza et al. | |
| 7,886,575 B2 * | 2/2011 | Haskell et al. | 73/24.01 |
| 8,174,170 B1 * | 5/2012 | Kuypers et al. | 310/368 |
| 2003/0117237 A1 | 6/2003 | Niu et al. | |
| 2005/0073078 A1 | 4/2005 | Lutz et al. | |
| 2007/0013464 A1 | 1/2007 | Pan Zhiyu et al. | |
| 2007/0052498 A1 | 3/2007 | Pan Zhiyu et al. | |
| 2008/0143217 A1 | 6/2008 | Ho et al. | |
| 2008/0204153 A1 | 8/2008 | Yoshida et al. | |
| 2008/0272852 A1 | 11/2008 | Six | |
| 2009/0108381 A1 | 4/2009 | Buchwalter et al. | |
| 2009/0108959 A1 | 4/2009 | Piazza et al. | |
| 2009/0144963 A1 | 6/2009 | Piazza et al. | |
| 2009/0243747 A1 | 10/2009 | Gaidarzhy et al. | |
| 2009/0294638 A1 | 12/2009 | Mohanty et al. | |
| 2010/0007443 A1 | 1/2010 | Mohanty et al. | |
| 2010/0026136 A1 | 2/2010 | Gaidarzhy et al. | |
| 2010/0134207 A1 | 6/2010 | Mohanty et al. | |
| 2010/0155883 A1 | 6/2010 | Wenzler et al. | |
| 2010/0181868 A1 * | 7/2010 | Gaidarzhy et al. | 310/313 B |
| 2010/0182102 A1 | 7/2010 | Kuypers et al. | |
| 2010/0314969 A1 * | 12/2010 | Gaidarzhy et al. | 310/321 |
| 2012/0280594 A1 * | 11/2012 | Chen et al. | 310/313 R |

FOREIGN PATENT DOCUMENTS

| | | |
|---|---|---|
| WO | WO 2006/000611 A1 | 1/2006 |
| WO | WO 2006/083482 A2 | 8/2006 |
| WO | WO 2006/124303 A1 | 11/2006 |
| WO | WO 2010/011288 A1 | 1/2010 |

OTHER PUBLICATIONS

International Search Report and Written Opinion from International Application No. PCT/US2010/000921 mailed Jul. 8, 2010.

International Search Report and International Preliminary Report on Patentability for PCT/US2006/021298 mailed Nov. 6, 2006 and Dec. 6, 2007 respectively.

Kaajakari et al., "Square-Extensional Mode Single-Crystal Silicon Micromechanical Resonator for Low-Phase-Noise Oscillator Applications," *IEEE Electron Device Letters* 25(4):173 (2004).

Khine et al., "7MHz length-extensional SOI resonators with T-shaped anchors," Solid-State Sensors, Actuators and Microsystems Conference: Transducers, Piscataway, NJ, US, Jun. 21, 2009.

Piazza et al., "Low motional resistance ring-shaped contour-mode aluminum nitride piezoelectric micromechanical resonators for UHF applications," Micro Electro Mechanical Systems, 2005. MEMS 2005. 18$^{th}$ IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

\* cited by examiner

US 8,446,078 B2

MECHANICAL RESONATING STRUCTURES AND METHODS

RELATED APPLICATIONS

The present application claims priority under 35 U.S.C. §119(e) to U.S. Patent Application Ser. No. 61/163,770, filed Mar. 26, 2009 entitled "Mechanical Resonating Structures and Methods", which is hereby incorporated herein by reference in its entirety.

BACKGROUND

1. Field

The technology described herein relates to mechanical resonating structures and methods.

2. Related Art

Mechanical resonators include a mechanical structure configured to vibrate in at least one dimension. Various modes of vibration are possible, in some of which the mechanical structure expands and contracts, while nodes within the structure undergo no displacement. Regardless of the vibration mode targeted, a mechanical resonating structure is generally attached at one or more points to a fixed support. The connections to the fixed support keep the resonating structure properly positioned, and can provide mechanical support.

Some microelectromechanical systems (MEMS) form, or include, mechanical resonators. In some such MEMS, the mechanical resonator includes a planar mechanical resonating structure, such as a suspended disc or plate. The planar resonating structure is connected to a supporting structure, typically a substrate, at one or more points. These connections are conventionally rigid and can degrade the performance of the resonating structure, in some instances by degrading the quality factor Q of the resonator.

SUMMARY

According to one aspect of the technology, a device comprises a body, a mechanical resonating structure, and a multi-element anchor coupling the mechanical resonating structure to the body. The multi-element anchor comprises a flexible element that is flexible in a direction perpendicular to a direction of vibration of the mechanical resonating structure.

According to another aspect, a device is provided comprising a body, a mechanical resonating structure, and a multi-element anchor coupling the mechanical resonating structure to the body. The multi-element anchor comprises a flexible element that is flexible in a direction parallel to a direction of vibration of the mechanical resonating structure.

According to another aspect, a method of operating a mechanical resonating structure coupled to a body by a multi-element anchor is described. The method comprises actuating the mechanical resonating structure so that the mechanical resonating structure vibrates in a primary direction and a secondary direction, and damping the vibration in the secondary direction using a flexible element of the multi-element anchor.

BRIEF DESCRIPTION OF THE DRAWINGS

Various embodiments of the technology will be described in connection with the following figures. It should be appreciated that the figures are not necessarily drawn to scale, and are intended for purposes of illustration only.

DETAILED DESCRIPTION

Figure 1:
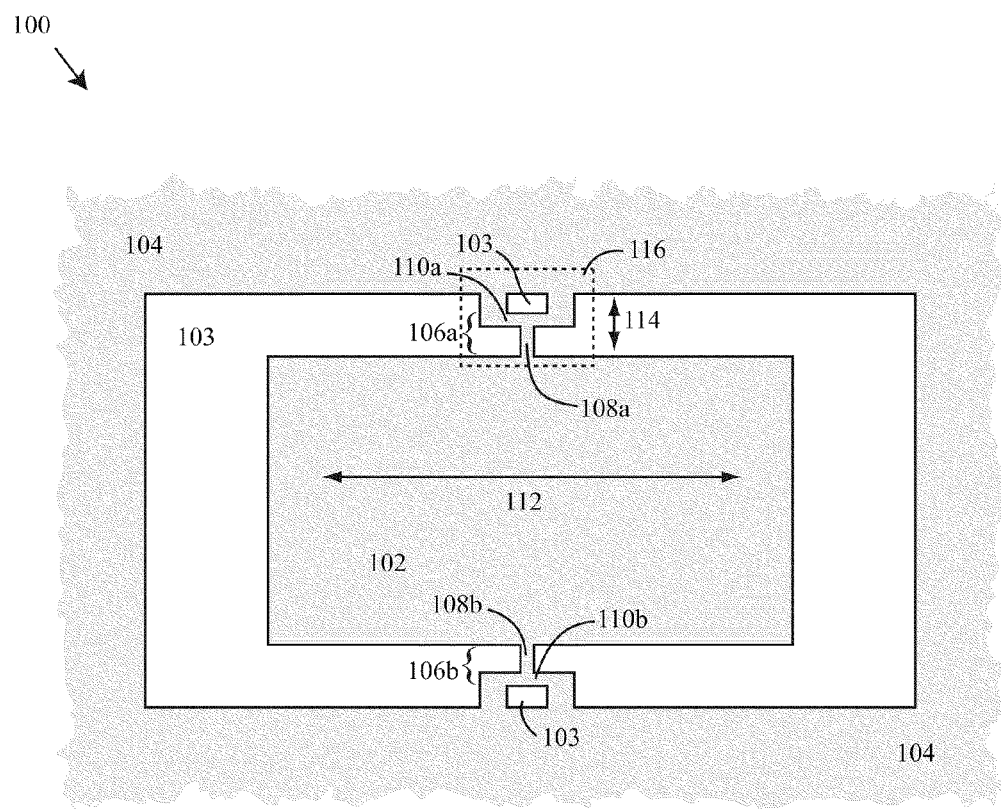
FIG. 1 illustrates a mechanical resonating structure connected to a substrate by two multi-element anchors, according to one embodiment of the present invention.

The technology described herein includes resonators and devices having a resonating structure connected to a body (e.g., a substrate) by one or more anchors. In some embodiments, the anchor is a multi-element anchor, including at least one flexible portion, or element, which may vibrate when the resonating structure vibrates. The length of the flexible element is chosen in some embodiments in dependence on the resonance frequency of the planar resonating structure. The anchor in some embodiments impedes the desired vibration (e.g., the targeted resonance behavior) of the resonating structure less so than conventional couplings between a resonating structure and a substrate, while also suppressing undesired vibration (e.g., spurious modes of vibration) of the resonating structure. In addition, irrespective of any vibration, the flexible nature of the anchor in some embodiments may relieve various types of stresses, such as, but not limited to, thermal induced stresses, material mismatch stresses, and packaging induced stresses, in that the anchor may flex in response to such stresses. In some embodiments, the resonating structure is substantially planar, although not all embodiments are limited in this manner. It should be appreciated that when components (e.g., anchors and resonating structures) are described herein as being "connected," they may be directly connected or connected through one or more additional components.

According to one aspect of the technology described herein, a MEMS resonator comprises a mechanical resonating structure (which may be substantially planar in some non-limiting embodiments) attached to a body (e.g., a semiconductor substrate, or any other type of body, which in some embodiments is fixed) by one or more anchors. The anchors may each comprise two or more elements, and thus may be referred to herein as multi-element anchors. One portion, or element, of the anchor may be connected to the resonating structure, while the second portion, or element, of the anchor may be connected to the substrate. At least one of the elements of the anchor may be flexible. For example, the element of the anchor connected to the substrate may be flexible.

In some embodiments, the flexible element(s) of the anchor may be flexible in a direction of unwanted vibration of the resonating structure. The particular direction of unwanted vibration may depend on the vibration mode and the shape of the resonating structure. For example, in some embodiments, the flexible element(s) may be oriented to flex in a direction perpendicular to a direction of vibration of the resonator. In other embodiments, the flexible element may be oriented to flex in a direction parallel to a direction of vibration of the resonator. In some embodiments, the multi-element anchor may be oriented perpendicularly to the normal vector formed at the contact point of the anchor to the resonating structure.

In some embodiments, the flexible element(s) may be flexible in a direction parallel to the normal vector at the contact point between the anchor and the resonating structure. Such orientations will be further explained in connection with the non-limiting specific embodiments discussed below in connection with the figures.

It should be appreciated that resonating structures, such as some of those described herein, may be capable of various modes of vibration and various resonance frequencies, with the various modes of vibration having different directions of vibration. Typically, one mode of vibration may dominate the others (i.e., be significantly larger than the other modes of vibration) over a particular frequency range of interest. In some embodiments, the configuration of the anchors described herein, and any flexible element(s) of the anchors, is chosen in dependence on a direction of vibration of the dominant vibration mode over a frequency range of interest. In some embodiments, the dominant mode of vibration is an in-plane mode of vibration, although other modes of vibration are also possible and the various aspects described herein are not limited to implementing any particular mode(s) of vibration.

In some embodiments, a mechanical resonating structure vibrates in a primary direction and secondary direction. The primary direction may be a direction of desired vibration, while the secondary direction, in some embodiments, may be a direction of unwanted vibration accompanying the primary vibration. For example, a resonator may be intended to exhibit primary vibration in the x-direction, but may also exhibit secondary vibration in the y-direction. The primary vibration may be larger than, or significantly larger than, the secondary vibration in some embodiments. For example, in some embodiments in which a mechanical resonating structure exhibits both primary and secondary vibration, the magnitude of the primary vibration is at least two times greater than the magnitude of the secondary vibration. In some such embodiments, the magnitude of the primary vibration is at least four times greater than the magnitude of the secondary vibration (e.g., at least 10 times greater, between 10 and 100 times greater, etc). In some embodiments, the magnitude of the primary vibration is approximately four times greater than the secondary vibration. According to some embodiments, the magnitude of the primary vibration is between approximately two and six times greater than the magnitude of the secondary vibration (e.g., three times greater, four times greater, any other suitable amount within this range). Thus, the various embodiments described herein involving primary and secondary vibration are not limited to the primary vibration being greater than the secondary vibration by any particular amount. Also, it should be appreciated that not all embodiments are limited to mechanical resonating structures exhibiting vibration in primary and secondary directions.

According to some embodiments, the resonating structure may be substantially planar, and it may be preferred that the resonating structure undergoes displacement substantially in one direction (e.g., an x-direction), with less substantial displacement in the other two directions (e.g., the y- and z-directions). Such modes may be described as in-plane modes of vibration. In such modes, multi-element anchors such as those described herein may be configured to impede the displacement in the preferred direction as little as possible, while minimizing displacement in one or both of the secondary directions (e.g., the y- and z-directions). For example, a multi-element anchor may include an element flexible in the y and/or z-directions in such modes. However, other configurations and other modes of vibration are also possible.

In some non-limiting embodiments, the flexible element of the anchor may have a length approximately equal to a multiple of one-quarter of the wavelength of a dominant mode of vibration of the resonating structure (e.g., a dominant bulk mode of vibration or other mode of vibration dominant on the resonating structure) or a Lamb wave supported by the mechanical resonating structure, or may have any suitable wavelength to exhibit one quarter wavelength-type behavior, according to some embodiments. In some embodiments, the anchor includes two elements, with one element oriented perpendicularly to the other element.

Those aspects of the technology described above, as well as additional aspects, will now be described in further detail. It should be appreciated that these aspects may be used alone, all together, or in any combination of two or more, as they are not limited in this respect.

As mentioned, according to one aspect, a MEMS resonator comprises a mechanical resonating structure which may be coupled to a substrate by one or more multi-element anchors. In some embodiments, the mechanical resonating structure is substantially planar, but not all embodiments are limited in this manner, as the mechanical resonating structure may take any suitable shape. FIG. 1 illustrates an example of such a resonator.

As shown in FIG. 1, resonator 100 comprising a mechanical resonating structure 102, which in this non-limiting example is formed from and coupled to a substrate 104. In some embodiments the mechanical resonating structure 102 may be substantially planar, although not all embodiments are limited in this manner. The mechanical resonating structure 102 is suspended above, and separated from, the substrate 104 by an air cavity 103 formed in the substrate 104, which cavity may be formed by wet or dry etching, or in any other suitable manner, as the various aspects described herein including cavities are not limited in the manner in which the cavities are formed. Also, it should be appreciated that the embodiments described herein are not limited to utilizing resonating structures suspended over an air cavity in a substrate. Rather, the resonating structures may be suspended in any suitable manner, for example using the formation of one or more sacrificial layers (as opposed to a substrate), or in any other manner, as the various aspects described herein are not limited in this respect. The mechanical resonating structure 102 in FIG. 1 is coupled to the substrate 104 by two multi-element anchors 106a and 106b, which in this non-limiting example are identical to each other, and will be described in further detail below. It should be appreciated that the various aspects described herein are not limited to the use of identical anchors.

It should be appreciated that the mechanical resonating structure 102 may take any suitable shape and dimensions, as well as being formed by any suitable material(s), to provide desired resonating behavior. For example, the mechanical resonating structure may be designed to have any desired resonance frequencies and frequencies of operation, and may be configured to provide output signals of any desired frequencies, as the various aspects described herein are not limited to use with mechanical resonating structures operating at any particular frequency. For example, the resonance frequencies and/or frequencies of operation of the mechanical resonating structures, and the frequencies of the output signals provided by the mechanical resonating structure may be between 1 kHz and 10 GHz. In some embodiments, they may be in the upper MHz range (e.g., greater than 100 MHz), or at least 1 GHz (e.g., between 1 GHz and 10 GHz). In some embodiments, they may be at least 1 MHz (e.g., 13 MHz, 26 MHz) or, in some cases, at least 32 kHz. In some embodiments, they may be in the range of 30 to 35 kHz, 60 to 70 kHz, 10 MHz to 1 GHz, 1 GHz to 3 GHz, 3 GHz to 10 GHz, or any other suitable frequencies. Thus, it should be appreciated that the frequencies are not limiting. In some embodiments, the mechanical resonating structure may be designed to operate in a bulk mode of vibration.

Similarly, the dimensions of the mechanical resonating structure may depend, in part, on the desired performance, including the desired operation frequency. According to some embodiments, the mechanical resonating structure can be a micromechanical resonator. The mechanical resonating structure may have a "large dimension" (i.e., the largest of the length, width, or thickness of the resonating portion) of less than 1 mm. In some embodiments, the large dimension is less than 500 microns, less than 100 microns, less than 10 microns, or less than 1 micron. Other dimensions are also possible.

Moreover, the mechanical resonating structure may have any suitable shape. For example, the configuration of the mechanical resonating structure may include an antenna type geometry, beams (e.g., free-free beams, clamped-clamped beams, free-clamped beams), cantilevers, discs, rings, prisms, cylinders, tubes, spheres, shells, springs, polygons, diaphragms, tori, any combination of those shapes listed, or any other suitable shape. In situations in which a mechanical resonating structure includes multiple elements, any of the mechanical resonating structure elements may be formed either in whole or in part of the same or different geometries. In addition, several different types of geometrical structures may be coupled together to obtain particular resonance mode responses.

The mechanical resonating structure may be actuated and detected in any suitable manner, and may be formed of materials suitable for the type(s) of actuation and/or detection. For example, suitable methods of actuation and/or detection include, but are not limited to, piezoelectric, piezoresistive, electrostatic, electrostrictive, electromotive, magnetostrictive, magnetomotive, thermal, spin-torque effect, spin-polarized current driven magnetic excitation, any combination of those types listed, or any other suitable types of actuation and/or detection. Accordingly, in some embodiments, the mechanical resonating structure may include one or more piezoelectric materials or semiconductor materials (e.g., silicon), in the form of layers or otherwise. Examples of suitable materials include, but are not limited to, aluminum nitride (AlN), zinc oxide (ZnO), cadmium sulfide (CdS), quartz, lead titanate ($PbTiO_3$), lead zirconate titanate (PZT), lithium niobate ($LiNbO_3$), and lithium tantalate ($LiTaO_3$). In some embodiments, AlN may be preferred.

In some embodiments, the mechanical resonating structure includes one or more electrode structures. Examples of suitable electrode material include, but are not limited to, aluminum (Al), molybdenum (Mo), titanium (Ti), chromium (Cr), ruthenium (Ru), gold (Au), platinum (Pt) or AlSiCu. In general, any suitable electrode material can be utilized for the electrode layer. In some embodiments, a thin layer of Ti and/or AlN may be added beneath the electrode to enhance crystal orientation of the active (e.g., piezoelectric) material layer.

Some examples of suitable mechanical resonating structures can be found in International Publication No. WO 2006/083482, U.S. patent application Ser. No. 12/181,531, filed Jul. 29, 2008 and published as U.S. Patent Application Publication No. 2010-0026136-A1, U.S. patent application Ser. No. 12/142,254, filed Jun. 19, 2008 and published as U.S. Patent Application Publication No. 2009-0243747-A1, U.S. patent application Ser. No. 12/639,161, filed Dec. 16, 2009 entitled "Mechanical Resonating Structures Including a Temperature Compensation Structure", and U.S. Patent Application Ser. No. 61/138,171, filed Dec. 17, 2008 entitled "Mechanical Resonating Structures Including a Temperature Compensation Structure", all of which are incorporated herein by reference in their entireties. It should be understood that other designs for suitable mechanical resonating structures are also possible, and that the various aspects described herein are not limited to use with any particular design of a mechanical resonating structure.

The mechanical resonating structure 102 in FIG. 1 is coupled to the substrate 104 by two multi-element anchors 106a and 106b, which in this non-limiting example are identical to each other, and will be described in further detail below in regard to FIG. 2. As mentioned previously, it should be appreciated that the various aspects described herein are not limited to utilizing identical anchors. In the non-limiting embodiments of FIGS. 1-2, the multi-element anchors 106a and 106b each comprise two elements, with one element oriented perpendicularly, or approximately perpendicularly, to the second element. However, it should be appreciated that not all embodiments of multi-element anchors according to the aspects of the technology described herein are limited to anchors having elements oriented perpendicularly to each other. Referring to anchor 106a, a first element 108a, which in the non-limiting example of FIG. 1 is a beam, is arranged perpendicularly to a second element 110a, which is also a beam in the non-limiting embodiment shown. Similarly, the anchor 106b comprises a first element 108b, shaped as a beam, arranged perpendicularly relative to a second element 110b, also shaped as a beam.

As will be described in further detail below, the second elements 110a and 110b of the anchors 106a and 106b, respectively, may be flexible, or at least partially flexible, along their lengths. Also, according to some embodiments, the flexible second elements 110a and 110b may flex in a direction substantially perpendicular to a direction of vibration of a dominant mode of vibration of the mechanical resonating structure 102 (e.g., a dominant bulk mode of vibration). For example, referring to FIG. 1, the mechanical resonating structure 102 may vibrate in the directions indicated by arrow 112 in a dominant mode of vibration (e.g., a dominant bulk mode). The anchor 106a may be capable of flexing in the directions indicated by the arrow 114, for example if the flexible element 110a is capable of flexing in that direction. The anchor 106b may operate similarly to the anchor 106a, being capable of flexing in the directions indicated by the arrow 114, which in the non-limiting embodiment of FIG. 1 is substantially perpendicular to the direction indicated by the arrow 112.

In FIG. 1, the multi-element anchors 106a and 106b are continuous with the mechanical resonating structure 102 and substrate 104. Thus, in some embodiments, the mechanical resonating structure 102 and multi-element anchors 106a and 106b are formed from the substrate material 104, for example by etching the air cavity 103 to form those structures. However, it should be appreciated that the various aspects described herein are not limited to including multi-element anchors formed of the same material as a substrate material. Rather, in some embodiments including multi-element anchors, the anchors may be distinct from the substrate and/or mechanical resonating structure, and may be formed of any suitable material, which may or may not be the same material used to form the mechanical resonating structure and/or the substrate. Thus, it should be appreciated that various configurations and materials may be used for the mechanical resonating structure, anchors, and substrate shown in FIG. 1.

Figure 2:
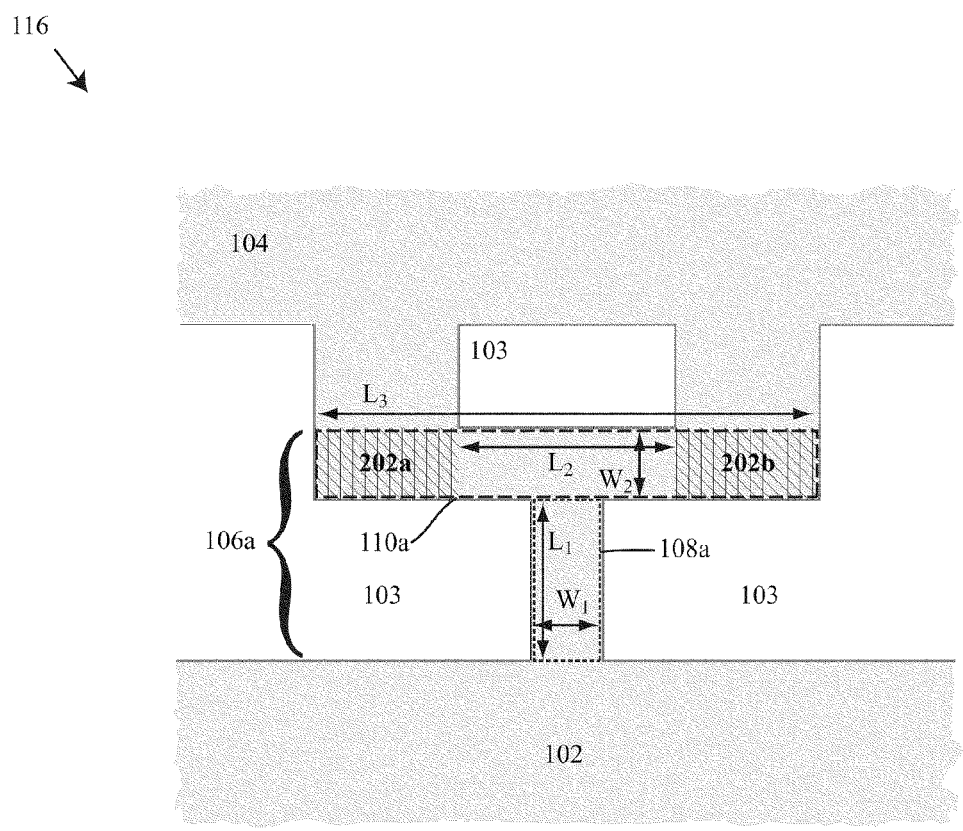
FIG. 2 illustrates a detailed view of a portion of the structure shown in FIG. 1.

FIG. 2 provides a detailed illustration of the portion of the resonator 100 of FIG. 1 enclosed within the dashed box 116. As shown, the multi-element anchor 106a comprises the first element 108a and the second element 110a. For purposes of illustration, the element 108a is delineated in FIG. 2 by a dotted box, and the element 110a is delineated by a dashed box. It should be appreciated that such delineations are provided for purposes of illustration only, and do not necessarily represent physical delineations between the elements, as, for example, the elements 108a and 110a may be continuous in some embodiments.

As shown in FIG. 2, in some embodiments, the second element 110a is perpendicular, or substantially perpendicular, to the first element 108a. Similarly, the first element 108a is perpendicular, or substantially perpendicular, to the mechanical resonating structure 102. However, it should be appreciated that not all embodiments are limited in this respect, as the mechanical resonating structure 102, first element 108a, and second element 110a may have any suitable positioning relative to each other.

As has been mentioned, according to some aspects of the technology described herein, a multi-element anchor includes a flexible element which may flex when a mechanical resonating structure anchored by the multi-element anchor vibrates. In the non-limiting example of FIGS. 1-2, the second element 110a may be flexible. As shown in FIG. 2, the second element 110a may be substantially shaped as a beam, and may have two ends, illustrated by shaded boxes 202a and 202b for purposes of explanation. It should be appreciated the ends 202a and 202b may have any size, including substantially zero width (in the direction along the length of the beam), and again are shown as boxes merely for purposes of explanation. In some embodiments, as described further below, the ends 202a and 202b may be fixed, or relatively inflexible compared to a flexible portion of the beam. For example, in one-limiting embodiment the second element 110a may be flexible between the two ends 202a and 202b, in a direction indicated by arrow 114 in FIG. 1. As has been mentioned, the direction indicated by arrow 114 may be parallel to the normal vector formed at the contact point between the first element 108a and the mechanical resonating structure 102, and is therefore perpendicular to the desired vibration direction of the mechanical resonating structure 102 in the this non-limiting example. In the non-limiting example of FIGS. 1-2, then, the second element 110a is oriented perpendicularly to this normal vector.

Several additional features of the second element 110a are now noted. First, the ends 202a and 202b may be fixed in some embodiments, such that they may exhibit less flexibility than the flexible portion of the second element 110a. In such embodiments, the ends 202a and 202b may be fixed in any suitable manner, as the various embodiments utilizing a flexible member with fixed ends are not limited in this respect. For example, the ends 202a and 202b may be "fixed" in that, due to the geometry of the anchor and its connections to the substrate, they may be relatively rigid and exhibit little movement, even though they may not be directly attached to any fixed object. Alternatively, as described further below in connection with FIG. 3, in some embodiments the ends may be fixed in that they may be directly attached to a fixed object, such as a post connected between the end(s) and the substrate. Other scenarios are also possible, as the various aspects described herein are not limited to use with flexible elements having fixed ends, and are not limited to fixing the ends in any particular manner in those embodiments in which the ends are fixed.

Secondly, it should be appreciated that the ends 202a and 202b, while being fixed in some embodiments, may not be so rigidly fixed in all embodiments that they cannot move. Rather, depending on the manner in which they are fixed (e.g., whether being bonded to a substrate, etched from a substrate material, etc.), they may, in some embodiments, exhibit some ability to flex. In addition, it should be appreciated that the shaded boxes designated by 202a and 202b do not necessarily represent physical delineations within the second element 110a, but rather are meant merely to illustrate portions of the element 110a corresponding to the ends of that element. It should be appreciated that FIG. 2 provides a non-limiting example of how a flexible element (e.g., second element 110a) may be flexible between two relatively fixed ends. Other configurations are also possible.

The first element 108a and the second element 110a may have any suitable dimensions, as the various aspects described herein are not limited to use of multi-element anchors having any particular dimensions. For example, in some embodiments, the width $W_1$ of the first element 108a may take a value as small as possible due to manufacturing limitations, such as being in the range of approximately 1-5 microns (e.g., 2 microns), or having any other suitable value. In some embodiments, the width $W_1$ may be designed to be smaller than, or in some embodiments substantially smaller than, the lengths $L_2$ and/or $L_3$ of the second element 110a, described below.

Similarly, the length $L_1$ of first element 108a may have any suitable value. In some embodiments, the length $L_1$ may be as small as possible, for example as small as is possible given manufacturing limitations. In such instances, the value of $L_1$ may be in the range of approximately 1-5 microns (e.g., 2 microns, 3 microns, etc.), or less. Alternatively, or additionally, in some embodiments $L_1$ may be approximately equal to $n\lambda/4$, where $\lambda$ equals the resonant wavelength of the mechanical resonating structure 102 and n is an integer. However, not all embodiments are limited in this respect, as $L_1$ may take any suitable value for a given application.

The second element 110a is shown as having two lengths, $L_2$ and $L_3$. The length $L_2$ represents the length of the flexible portion of the second element 110a, i.e., the length between the ends 202a and 202b. The length $L_3$ represents the total length of the second element 110a. It should be appreciated from the discussion, above, relating to the various manners in which the ends 202a and 202b may be fixed in some embodiments, that in some embodiments $L_2$ and $L_3$ may be substantially equal, although not all embodiments are limited to such a relationship.

In some embodiments, the length $L_2$ may be approximately equal to a multiple of one quarter of the wavelength of the resonance frequency of the resonating structure 102 (i.e., $n\lambda/4$, where $\lambda$ equals the resonant wavelength of the mechanical resonating structure 102 and n is an integer), and therefore may exhibit ¼ wavelength-type behavior. For example, in some embodiments $L_2$ may be in the range of approximately 5-50 microns (e.g., 20 microns, 25 microns, etc.), or may have any other suitable value. It should also be appreciated that the value of $L_2$ may not be a fixed value. For example, as mentioned above, in some embodiments the ends 202a and 202b may be capable of some degree of flexing/movement, so that the length $L_2$ may vary depending on the degree of flexing exhibited by the ends 202a and 202b. Even so, it should be appreciated that in some embodiments the total flexible length of the second element 110a (i.e., its effective length) may have a value such that the second element 110a exhibits ¼ wavelength-type behavior, irrespective of whether its physical length is equal to $n\lambda/4$.

The width $W_2$ of the second element 110a may also take any suitable value. Because the second element 110a is shaped like a beam, its resonance frequency may be defined by the relative values of its length and width. Therefore, in some embodiments, the length $L_2$ and width $W_2$ may be chosen such that the second element 110a has a desired resonance frequency. However, not all embodiments are limited in this respect. It should be further appreciated that the width $W_2$ may not be uniform in all embodiments, and that, similarly, the width $W_1$ may not be uniform in all embodiments.

While FIGS. 1-2 have illustrated one non-limiting example of a multi-element anchor which may be used to couple a mechanical resonating structure to a substrate, other shapes of suitable multi-element anchors are also possible, and the various aspects of the technology described herein are not limited to use with any particular shape of a multi-element anchor. For example, referring to FIG. 3, an alternative shape for a multi-element anchor is illustrated. The multi-element anchor 300 comprises a first element 302 arranged perpendicularly to a second element 304. The first element 302 may be proximate to and connected to a substantially planar mechanical resonating structure, such as the mechanical resonating structure 102 shown, while the second element 304 may be proximate a substrate, and therefore distal to the mechanical resonating structure in the plane of the mechanical resonating structure. One or both of the first and second elements 302 and 304 may be flexible, and may have any suitable dimensions, such as those dimensions listed above with respect to the multi-element anchor 106a.

Figure 3:
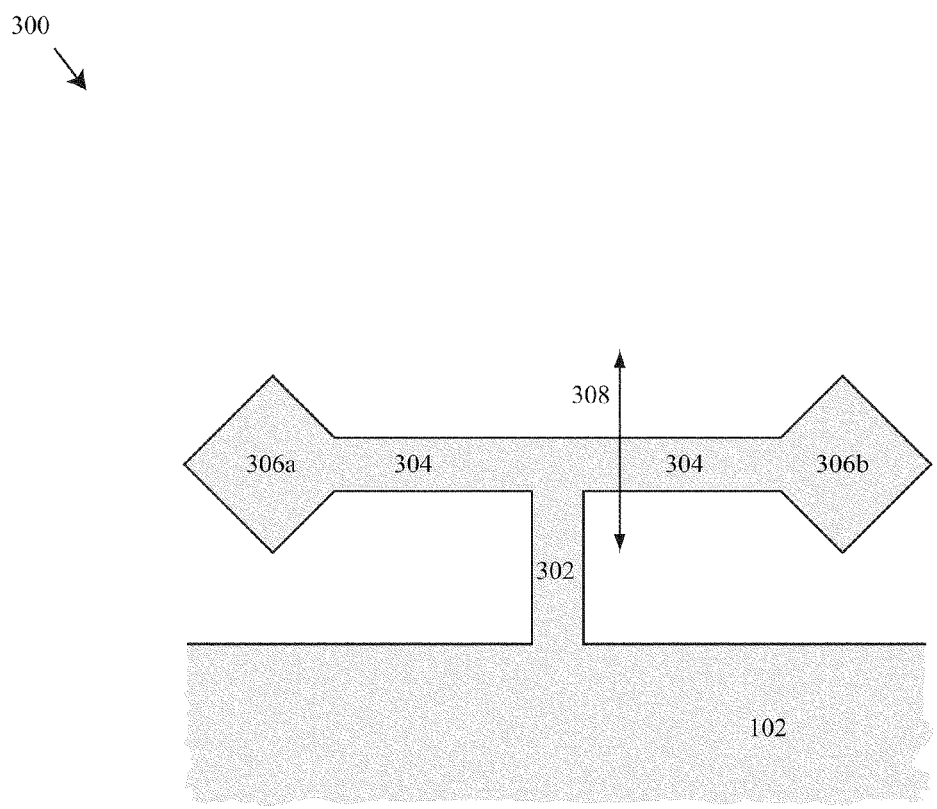
FIG. 3 illustrates an alternative form of a multi-element anchor, according to another embodiment.

In the non-limiting example of FIG. 3, the multi-element anchor 300 further comprises posts 306a and 306b, which may represent posts extending to a substrate (for example, in and out of the page in FIG. 3) to support the second element 304. The posts 306a and 306b may therefore be relatively rigid in some embodiments compared to the second element 304, which may flex between the posts, for example in a direction indicated by the arrows 308. The posts 306a and 306b may be formed of any suitable material, including the same material used to form elements 302 and/or 304, such as any of the materials previously listed herein, or any other suitable materials. Configurations for multi-element anchors other than those shown in FIGS. 1-3 are also possible, as the various aspects of the technology described herein are not limited to use with multi-element anchors taking the form of those shown in FIGS. 1-3.

Figure 4:
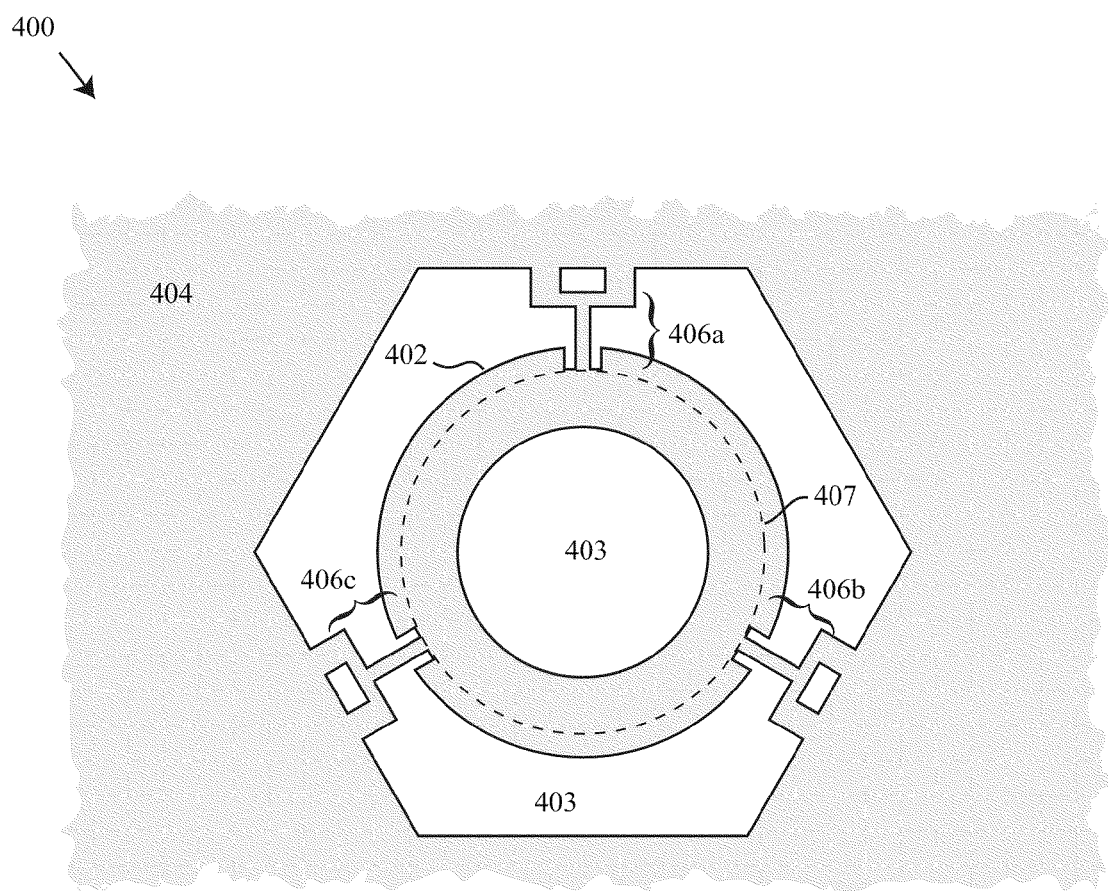
FIG. 4 illustrates an alternative resonator design including a ring-shaped mechanical resonating structure connected to a substrate by three flexible multi-element anchors, according to another embodiment.

Resonators implementing multi-element anchors such as those described herein may use any suitable number and/or placement of such anchors. FIGS. 1-2 illustrate an example in which two multi-element anchors are used, and in which those anchors are connected to opposing sides of a mechanical resonating structure. However, other configurations are also possible, and the various aspects described herein are not limited to use with any particular number and/or placement of anchors. For example, FIG. 4 illustrates a resonator 400 comprising a ring-shaped mechanical resonating structure 402 connected to a substrate 404, and suspended above an air cavity 403 in the substrate 404 by three multi-element anchors 406a, 406b, and 406c. The multi-element anchors 406a-406c may each be substantially similar, or identical in some embodiments, to the multi-element anchors 106a-106b shown and described above in connection with FIGS. 1-2, and may be substantially similar, or identical in some embodiments, to each other. However, not all embodiments are limited in this respect.

As shown in FIG. 4, in some embodiments in which a ring-shaped mechanical resonating structure is coupled to a substrate by one or more flexible multi-element anchors, one or more of the anchors are oriented parallel to a normal vector at the point at which the multi-element anchor(s) contacts the mechanical resonating structure. Accordingly, in some embodiments, the multi-element anchors may suppress, or dampen, to some degree, unwanted motion of the ring-shaped mechanical resonating structure. For example, the multi-element anchor may flex in a direction parallel to the direction of unwanted motion. Such flexing of the multi-element anchor in a direction parallel to a direction of motion of the mechanical resonating structure may be particularly applicable in situations in which the mechanical resonating structure is ring-shaped or disc-shaped, but is not limited in this respect, as it may also apply in rectangular geometries, or to resonators of any other shape.

According to some embodiments, the mechanical resonating structure may be configured to vibrate in multiple directions, for example in a primary direction and secondary direction. The vibration in the primary direction may, in some embodiments, be larger than, or significantly larger than, the vibration in the secondary direction. For example, the vibration in the primary direction may be the desired vibration of the mechanical resonating structure, while the vibration in the secondary direction may be unwanted vibration accompanying the desired vibration in the primary direction. The multi-element anchor may be configured to flex in a direction parallel to the direction of the secondary vibration, and in some embodiments may damp, or dampen, the vibration in the secondary direction.

As shown in FIG. 4, in some embodiments the multi-elements anchors may contact the ring-shaped mechanical resonating structure 402 at the dashed node line 407, corresponding to a node of vibration of the ring-shaped mechanical resonating structure in a vibration mode of interest. Such a configuration may be achieved by suitable etching of the multi-element anchors, the mechanical resonating structure, or in any other suitable manner. Other configurations are also possible.

Figure 5:
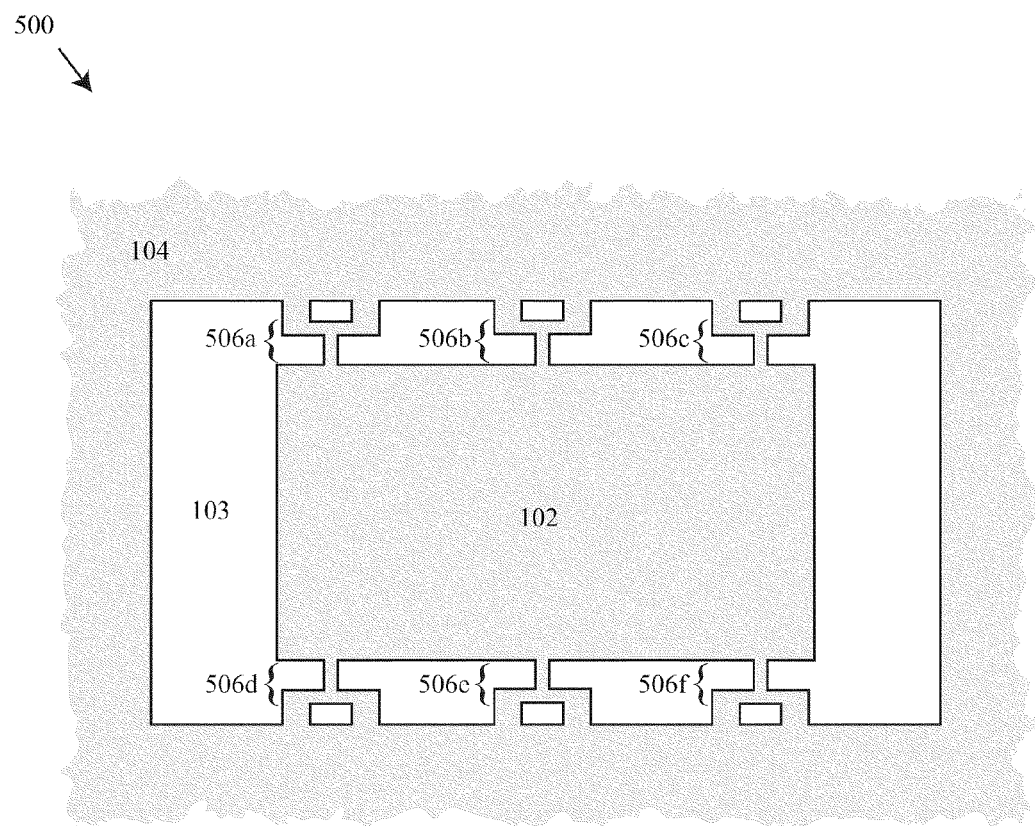
FIG. 5 illustrates a mechanical resonating structure connected to a substrate by six multi-element anchors, according to another embodiment of the present invention.

As another non-limiting example, FIG. 5 illustrates a resonator 500 representing a variation of the resonator 100 of FIG. 1, in which the mechanical resonating structure is coupled to the substrate 104 by six multi-element anchors 506a-506f. In this non-limiting example, the six multi-element anchors may be substantially identical to each other, and each may be substantially identical to previously described anchors 106a and 106b. The use of additional anchors, such as that shown in FIG. 5, may increase the mechanical support provided by the anchors to the mechanical resonating structure. Again, FIGS. 1, 4, and 5 provide non-limiting examples of resonators utilizing different numbers of multi-element anchors, and other numbers of anchors may alternatively be used.

According to some embodiments, multi-element anchors, such as those shown and described herein, may be connected to a mechanical resonating structure at vibration nodes of the mechanical resonating structure. For example, referring again to FIG. 1, the multi-element anchors 106a-106b may connect to the mechanical resonating structure 102 at vibration nodes of the mechanical resonating structure 102. If more than two anchors are used with a mechanical resonating structure 102 like that shown in FIG. 1 (e.g., if four anchors are used instead of two in FIG. 1), each of the anchors may connect to the mechanical resonating structure 102 at a vibration node of the mechanical resonating structure. However, it should be appreciated that not all embodiments are limited in this respect.

It should be appreciated that the resonating structures described herein may be used as stand alone components, or may be incorporated into various types of devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structure is integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some devices, multiple processes are run simultaneously, and the execution of such processes relies on a clock signal that is generated by an mechanical resonating structure. According to some embodiments, a mechanical resonating structure may also be coupled to additional circuitry, such as filters, mixers, dividers, amplifiers, or other application specific components and devices.

Having thus described several aspects of at least one embodiment of this invention, it is to be appreciated various alterations, modifications, and improvements will readily occur to those skilled in the art. Such alterations, modifications, and improvements are intended to be part of this disclosure. Accordingly, the foregoing description and drawings are by way of example only.

It should also be appreciated that while several references have been incorporated herein by reference, the present application controls should there be any contradiction between the present application and the references.

What is claimed is:

1. A device comprising:
    a body;
    a substantially rectangular mechanical resonating structure comprising two opposing sides and configured to support in-plane Lamb wave vibration in a direction substantially parallel to the two opposing sides; and
    a multi-element anchor coupling the mechanical resonating structure to the body and connected to a side of the mechanical resonating structure, the multi-element anchor comprising a flexible element that is flexible in a direction perpendicular to a direction of vibration of the mechanical resonating structure.

2. The device of claim 1, wherein the body is a substrate.

3. The device of claim 2, wherein the mechanical resonating structure is substantially planar.

4. The device of claim 2, wherein the multi-element anchor comprises a first element proximate the mechanical resonating structure and a second element distal the mechanical resonating structure and contacting the substrate, the second element being the flexible element.

5. The device of claim 4, wherein the second element is flexible in a direction perpendicular to a direction of vibration of a dominant in-plane vibration mode of the mechanical resonating structure.

6. The device of claim 4, wherein the first and second elements of the multi-element anchor are oriented substantially perpendicularly to each other.

7. The device of claim 4, wherein the first element of the multi-element anchor is a beam and has a length approximately equal to a multiple of one quarter of a wavelength of a resonance frequency of vibration of the mechanical resonating structure.

8. The device of claim 4, wherein the first element of the multi-element anchor is a beam and has a length of less than approximately 5 microns.

9. The device of claim 8, wherein the first element of the multi-element anchor has a width of less than approximately 5 microns.

10. The device of claim 4, wherein the first element of the multi-element anchor is a beam and has a width of less than approximately 5 microns.

11. The device of claim 4, wherein the second element of the multi-element anchor comprises two ends fixed to the substrate, and wherein the second element is flexible between the two ends.

12. The device of claim 11, wherein the second element of the multi-element anchor is a beam, the beam having a length and width defining a resonance frequency of the beam to be approximately equal to a resonance frequency of the mechanical resonating structure.

13. The device of claim 11, wherein a length of a flexible portion of the second element is approximately equal to a multiple of ¼ of a wavelength of a resonance frequency of the mechanical resonating structure.

14. The device of claim 13, wherein the length of the flexible portion of the second element is in the range of approximately 5-50 microns.

15. The device of claim 2, wherein the mechanical resonating structure has a largest dimension less than approximately 1000 microns.

16. The device of claim 2, wherein the mechanical resonating structure has a resonance frequency between approximately 1 kHz and 1 GHz.

17. The device of claim 2, wherein the mechanical resonating structure has a resonance frequency between approximately 1 GHz and 10 GHz.

18. The device of claim 2, wherein the device comprises two or more multi-element anchors coupling the mechanical resonating structure to the substrate.

19. The device of claim 18, wherein the device comprises four multi-element anchors coupling the mechanical resonating structure to the substrate.

20. The device of claim 18, wherein the device comprises six multi-element anchors coupling the mechanical resonating structure to the substrate.

21. A method of operating a substantially rectangular mechanical resonating structure comprising two opposing sides and configured to support in-plane Lamb wave vibration in a direction substantially parallel to the two opposing sides and coupled to a body by a multi-element anchor, the method comprising:
    actuating the substantially rectangular mechanical resonating structure so that the substantially rectangular mechanical resonating structure exhibits in-plane Lamb wave vibration with vibration in a primary direction and a secondary direction, the primary direction being substantially parallel to a side of the substantially rectangular mechanical resonating structure and the secondary direction being substantially perpendicular to the primary direction; and
    damping the vibration in the secondary direction using a flexible element of the multi-element anchor,
    wherein damping the vibration comprises flexing the flexible element of the multi-element anchor in a direction substantially parallel to the secondary direction.

22. The device of claim 4, wherein the first element of the multi-element anchor is a beam and has a length approximately equal to a multiple of one quarter of a wavelength of a Lamb wave supported by the mechanical resonating structure.

23. The device of claim 2, wherein corners of the mechanical resonating structure are not anchored.

24. A device comprising:

a substrate;

a substantially rectangular, planar mechanical resonating structure comprising two opposing sides and configured to support in-plane Lamb wave vibration in a direction substantially parallel to the two opposing sides; and first and second multi-element anchors coupling the mechanical resonating structure to the substrate and connected to respective ones of the two opposing sides of the mechanical resonating structure, each of the first and second multi-element anchors comprising a first element proximate the mechanical resonating structure and a second element distal the mechanical resonating structure and contacting the substrate, the second element being a flexible element that is configured to flex in a direction perpendicular to the direction of the in-plane Lamb wave vibration of the mechanical resonating structure, wherein the first and second elements of each of the first and second multi-element anchors are oriented substantially perpendicularly to each other.

25. The device of claim 24, wherein the first element of each first multi-element anchor is a beam and has a length approximately equal to a multiple of one quarter of a wavelength of the in-plane Lamb wave vibration supported by the mechanical resonating structure.

26. The device of claim 25, wherein the substantially rectangular, planar mechanical resonating structure comprises an active layer comprising a piezoelectric material, and wherein the substantially rectangular, planar mechanical resonating structure further comprises one or more electrodes configured to activate the in-plane Lamb wave vibration via piezoelectric actuation of the active layer.

27. The device of claim 24, wherein the second element of each multi-element anchor is a beam, the beam having a length and width defining a resonance frequency of the beam to be approximately equal to a resonance frequency of the mechanical resonating structure.

28. The device of claim 24, wherein a length of a flexible portion of the second element of each multi-element anchor is approximately equal to a multiple of ¼ of a wavelength of a resonance frequency of the mechanical resonating structure.

29. The device of claim 28, wherein the length of the flexible portion of the second element of each multi-element anchor is in the range of approximately 5-50 microns.

* * * * *